(12) United States Patent
Pedersen et al.

(10) Patent No.: US 11,265,641 B2
(45) Date of Patent: Mar. 1, 2022

(54) MICROELECTROMECHANICAL SYSTEMS VIBRATION SENSOR

(71) Applicant: Knowles Electronics, LLC, Itasca, IL (US)

(72) Inventors: Michael Pedersen, Long Grove, IL (US); Venkataraman Chandrasekaran, Chicago, IL (US); Joshua Watson, Wheaton, IL (US); Jeremy Johnson, Glen Ellyn, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/844,831

(22) Filed: Apr. 9, 2020

(65) Prior Publication Data

US 2020/0245053 A1 Jul. 30, 2020

Related U.S. Application Data

(63) Continuation-in-part of application No. 16/711,386, filed on Dec. 11, 2019.

(60) Provisional application No. 62/778,741, filed on Dec. 12, 2018.

(51) Int. Cl.
*H04R 1/10* (2006.01)
*B81B 7/00* (2006.01)
(Continued)

(52) U.S. Cl.
CPC ......... *H04R 1/1041* (2013.01); *B81B 3/0035* (2013.01); *B81B 7/008* (2013.01);
(Continued)

(58) Field of Classification Search
CPC .... H04R 19/00; H04R 19/005; H04R 19/016; H04R 19/04; H04R 2201/003;
(Continued)

(56) References Cited

U.S. PATENT DOCUMENTS

2006/0137455 A1* 6/2006 Yasuda ................. G01H 11/06
73/652
2012/0025335 A1* 2/2012 Leclair ................. H01L 23/562
257/416
(Continued)

FOREIGN PATENT DOCUMENTS

JP 10-019577 1/1998
JP 2004-233080 8/2004
(Continued)

OTHER PUBLICATIONS

Jeong, Kang Min, International Search Report, International Application No. PCT/US2019/065821, European Patent Office, Seo-gu, Daejeon, 35208, Republic of Korea, dated Jul. 3, 2020.

*Primary Examiner* — Walter F Briney, III
(74) *Attorney, Agent, or Firm* — Loppnow & Chapa; Matthew C. Loppnow (57) ABSTRACT

A MEMS vibration sensor die can include a substrate having a top portion, a mounting surface, and an aperture extending at least partially through the substrate. The die can include a first electrode coupled to the top portion of the substrate and positioned over the aperture. The die can include a second electrode disposed between the substrate and the first electrode. The second electrode can be spaced apart from the first electrode. The die can include a proof mass that can have a first portion coupled to the first electrode or the second electrode. The proof mass can have a second end opposite the first portion. The second end can be recessed within the aperture relative to the mounting surface of the substrate. The proof mass can be suspended freely within the aperture. The proof mass can move the first electrode or the second electrode from which it is suspended in response to vibration.

16 Claims, 5 Drawing Sheets

(51) Int. Cl.
*B81B 3/00* (2006.01)
*H04R 31/00* (2006.01)
*B81B 7/02* (2006.01)

(52) U.S. Cl.
CPC .............. *B81B 7/02* (2013.01); *H04R 31/006* (2013.01); *B81B 2201/0257* (2013.01)

(58) Field of Classification Search
CPC ..... H04R 2410/00; B81B 3/00; B81B 3/0018; B81B 3/0021; B81B 3/0051; B81B 7/0016; B81B 7/02; B81B 2201/00; B81B 2201/0257; B81B 2201/0285; B81B 2207/01; B81B 2207/012; B81B 2207/015
See application file for complete search history.

(56) References Cited

U.S. PATENT DOCUMENTS

| | | | | |
|---|---|---|---|---|
| 2013/0205899 | A1* | 8/2013 | Wu | B81B 7/02 73/510 |
| 2016/0207756 | A1* | 7/2016 | Chang | B81B 3/0005 |
| 2017/0156002 | A1* | 6/2017 | Han | H04R 19/04 |
| 2017/0374442 | A1* | 12/2017 | Pennock | H04R 19/005 |
| 2019/0323881 | A1 | 10/2019 | Mögelin | |
| 2019/0335271 | A1 | 10/2019 | Post | |

FOREIGN PATENT DOCUMENTS

| | | |
|---|---|---|
| JP | 2008-099212 | 4/2008 |
| JP | 2015-056881 | 3/2015 |

\* cited by examiner

MICROELECTROMECHANICAL SYSTEMS VIBRATION SENSOR

BACKGROUND

1. Field

The present disclosure relates generally to Microelectromechanical Systems (MEMS) transducer assemblies including a vibration sensor.

2. Introduction

Presently, MEMS microphones are used in electronic devices to detect movement of the devices. Advancements in micro and nanofabrication technologies have led to the development of progressively smaller MEMS microphones. MEMS microphones sensors can be incorporated into compact devices such as cell phones, laptops, smart watches, headphones, other compact devices, as well as other devices in general. This is because MEMS microphones are relatively small, which is useful when space is at a premium on various devices.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

At least some embodiments can provide a MEMS vibration sensor die. The die can include a substrate having a top portion, a mounting surface, and an aperture extending at least partially through the substrate. The die can include a first electrode coupled to the top portion of the substrate and positioned over the aperture. The die can include a second electrode disposed between the substrate and the first electrode. The second electrode can be spaced apart from the first electrode. The die can include a proof mass. The proof mass can have a first portion coupled to the first electrode or the second electrode. The proof mass can have a second end opposite the first portion. The second end can be recessed within the aperture relative to the mounting surface of the substrate. The proof mass can be suspended freely within the aperture. The proof mass can move the first electrode or the second electrode from which it is suspended in response to vibration. In some implementations, the die comprises a semiconductor material and is fabricated using photolithographic processes known to those of ordinary skill in the art.

At least some embodiments can provide for vibration sensor robustness. For example, a proof mass in the vibration sensor can be confined to prevent fracture of an electrode, such as a polysilicon diaphragm, in situations when the sensor is shocked from an impact. For example, a vibration sensor can include a relatively large proof mass coupled to a diaphragm and certain forces can damage the diaphragm or proof mass. Also, large deflections may cause the diaphragm to collide with a back plate and/or break the diaphragm, back plate, or a runner connecting the diaphragm to the substrate. Thus, in at least some implementations, the die can be configured to reduce or eliminate the likelihood of damage.

For example, at least some embodiments can provide structures added to a proof mass and/or the substrate to physically limit the vertical or lateral travel of the proof mass to within ranges that will not cause damage. This can provide for shock robustness of a vibration sensor, which can also be used as an accelerometer. In at least some embodiments, the proof mass can be recessed relative to a mounting surface of the dies to prevent damage during fabrication and singulation of the die from a wafer and during assembly of the die onto a base or substrate of the sensor package.

Referring to different possible embodiments shown in FIGS. 1-7, a MEMS vibration sensor die 100 can include a substrate 110 and a proof mass 130. The die 100 can include and/or can be formed of multiple substrates, one or more dielectric layers, one or more metal layers, one or more semiconductors, one or more layers of material forming the substrate, and/or other materials.

Referring to the different possible embodiments shown in FIGS. 1, 3, 5, and 7, the die 100 can include a first electrode 121, and a second electrode 122, at least one of which move relative to the other during operation. The moving electrode may be the first electrode or second electrode and be of the free-plate type or the constrained-plate type. According to a possible implementation, the first electrode 121 can be a back plate and the second electrode 122 can be a diaphragm. The substrate 110 can also include an aperture 116 extending at least partially through the substrate.

Figure 1:
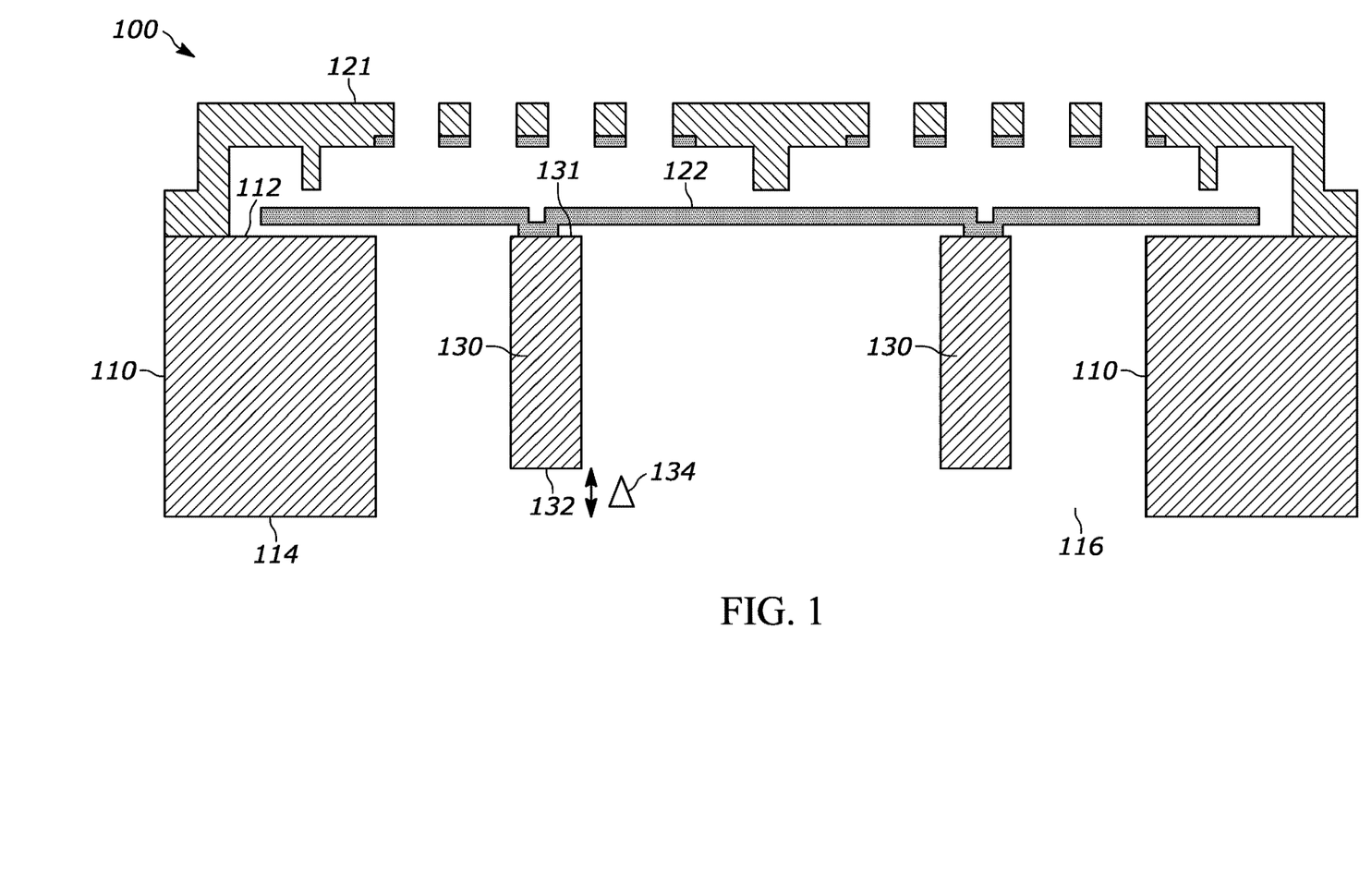
FIG. 1 is a side cross-section view of a vibration sensor die, according to a possible embodiment.
Figure 3:
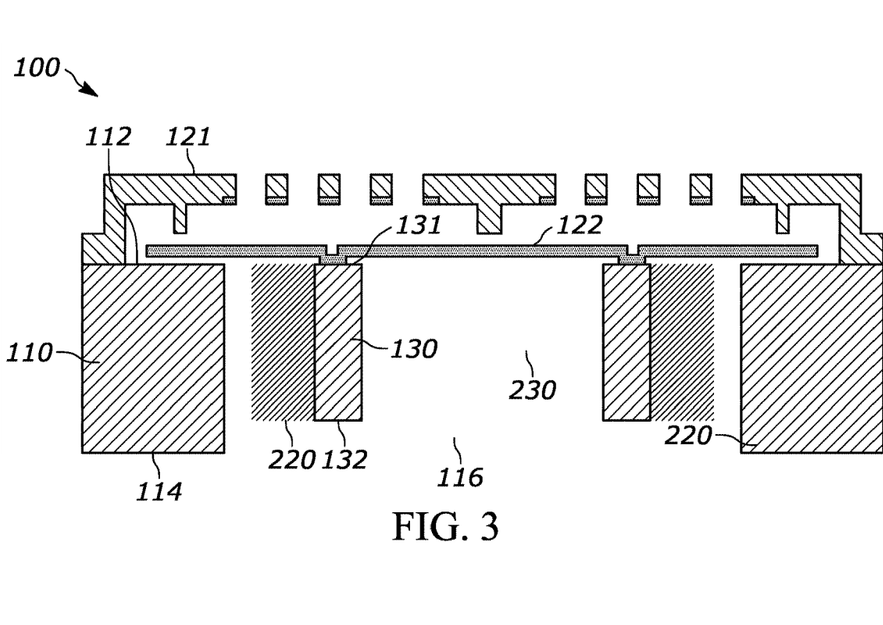
FIG. 3 is a side cross-section view of a vibration sensor die, according to a possible embodiment.
Figure 5:
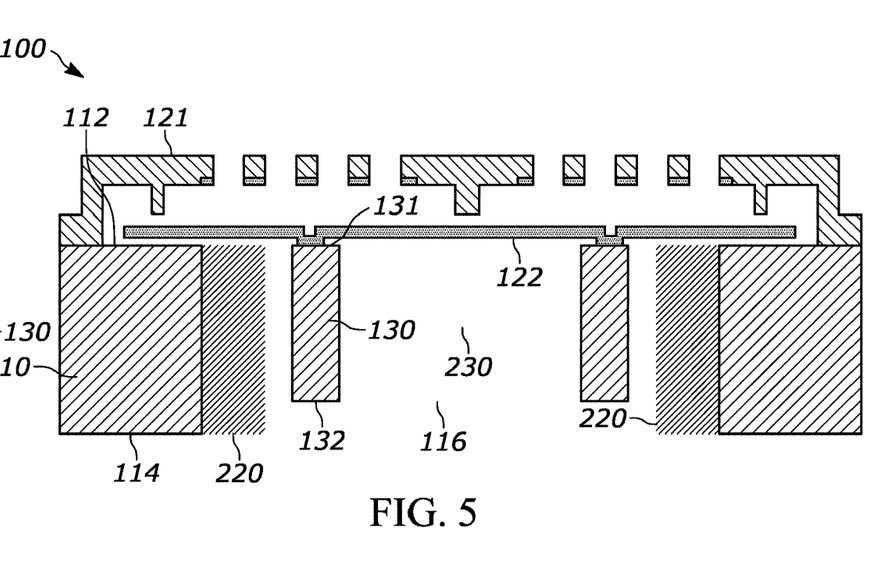
FIG. 5 is a side cross-section view of a vibration sensor die, according to a possible embodiment.

Referring to the different possible embodiments shown in FIGS. 1, 3, and 5, the substrate 110 can have a top portion 112, a mounting surface 114, and an aperture 116 extending at least partially through the substrate 110. The first electrode 121 can be coupled to the top portion 112 of the substrate 110 and positioned over the aperture 116. The second electrode 122 can be disposed between the substrate 110 and the first electrode 121. The second electrode 122 can be spaced apart from the first electrode 121.

The proof mass 130 can have a first portion 131 coupled to the first electrode 121 or the second electrode 122. In the illustrated embodiments, the first portion 131 is shown coupled to the second electrode 122. The proof mass 130 can have a second end 132 opposite the first portion 131. The proof mass 130 can be suspended freely within the aperture 116. The proof mass 130 can move the first electrode 121 or the second electrode 122 from which it is suspended in response to vibration.

Referring to a possible embodiment of FIG. 1, the second end 132 can be recessed 134 within the aperture 116 relative to the mounting surface 114 of the substrate 110. According to a possible implementation, a height of the proof mass 130 can be etched back, so that the proof mass is recessed relative to the substrate 110. In one implementation, the height of the proof mass 130 can be reduced 134 by an amount between 10 um to at least 50 um. In other implementations, the extent to which the proof mass is recessed can be different depending on the size of the proof mass and other part of the die, specified range of motion of the proof mass, intended use case, etc.

According to one aspect of the disclosure, the die can include a lateral support member adjacent the proof mass, wherein the lateral support member limits movement of the proof mass in a direction non-parallel to a direction of movement of the first or second electrode to which the proof mass is coupled. Referring to possible embodiments of FIGS. 2-5, part of the substrate. The lateral support member 210 can be part of the substrate 110. Alternatively, the lateral support member can be another member located between the substrate and the proof mass, or a fixed member about which the proof mass is disposed. Spacing between the proof mass 130 and the lateral support member 210 can be such that the lateral support member 210 can prevent the proof mass 130 from breaking. The specific dimensions of the spacing can depend on the size of the proof mass and other parts of the die, specified range of motion, intended use case, etc.

Figure 2:
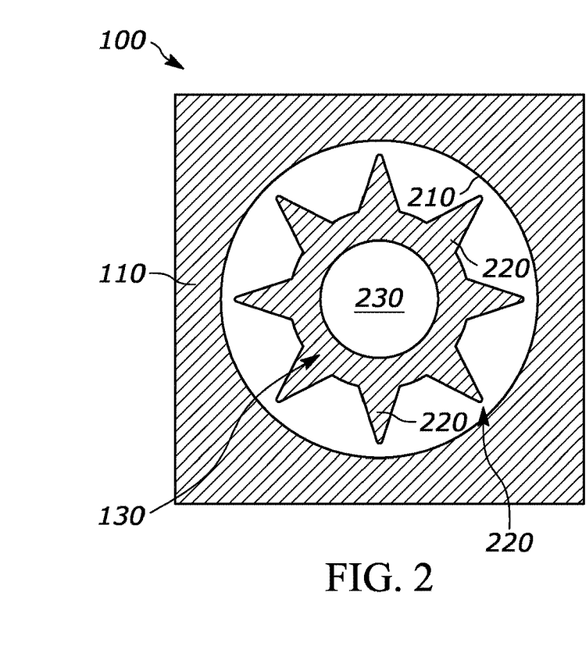
FIG. 2 is a top sectional view of a vibration sensor die, according to a possible embodiment.
Figure 4:
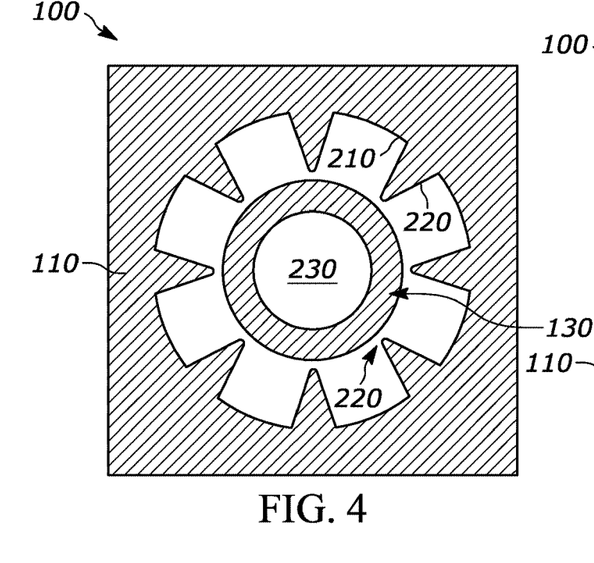
FIG. 4 is a top sectional view of a vibration sensor die, according to a possible embodiment.

According to a possible embodiment, the die 100 can include a plurality of protrusions 220. The plurality of protrusions 220 can extend from the substrate 110 toward the proof mass 130 as shown in FIGS. 4 and 5 or from the proof mass 130 toward the substrate 110 as shown in FIGS. 2 and 3. The lateral support member 210 can be a part of the substrate 110 from which the protrusions 220 extend or a part of the substrate 110 toward which the protrusions 220 extend from the proof mass 130. For example, according to a possible embodiment, FIGS. 2 and 3 illustrate the protrusions 220 extending from the proof mass 130 toward the substrate 110. As another example embodiment, FIGS. 4 and 5 illustrate the protrusions 220 extending from the substrate 110 toward the proof mass 130. According to possible implementations the protrusions 220 can be fins, posts, cups, any other protrusion shapes. The protrusions 220 can be sized to minimize added mass, to maintain sensitivity, and/or to reduce lateral travel, such as to less than 15 um.

According to a possible embodiment, the proof mass 130 can have a hollow portion 230 and the substrate 110 can substantially surrounds the proof mass 130. The proof mass 130 and the substrate 110 can have any generally complementary shapes. According to a possible implementation, a lateral support member can be inside the hollow portion 230 of the proof mass 130.

Figure 6:
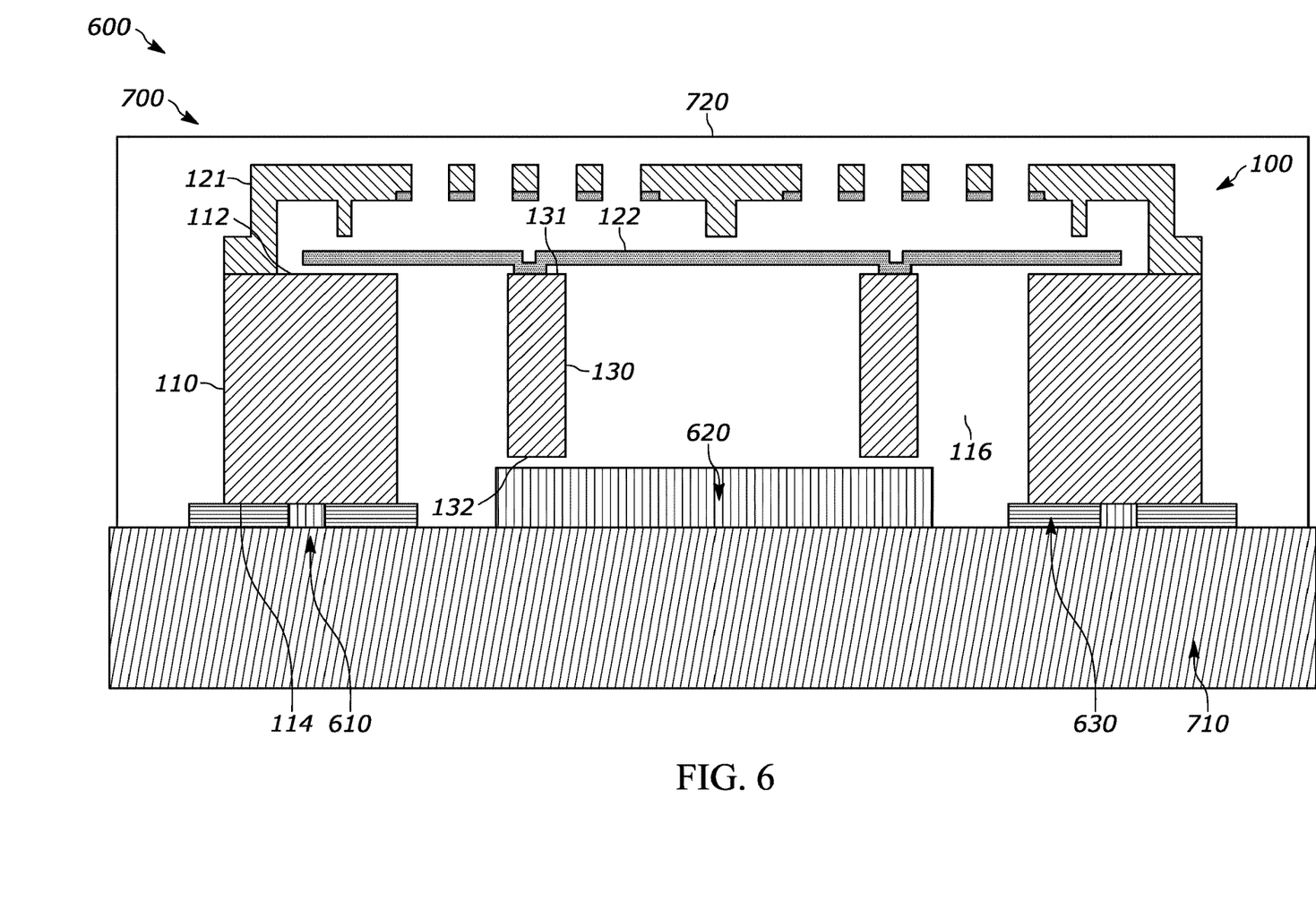
FIG. 6 is a side cross-section view of a vibration sensor assembly including the vibration sensor die of FIG. 1, according to a possible embodiment.

FIG. 6 is a side cross-section view of a vibration sensor assembly 600 including the vibration sensor die 100, according to a possible embodiment. The die 100 can include at least one rigid post 610 protruding from the mounting surface 114 of the substrate 110. The post 610 can be formed integrally with the substrate 110. The post can also be formed integrally with the base portion 710 or can be separate from the substrate 110 and the base portion 710. According to a possible embodiment, the post 610 can reduce variation in thickness of a die attach, like adhesive 630, that can couple the substrate 110 to the base portion 710. The at least one rigid post 610 can be embedded in the adhesive 630 and disposed between the mounting surface 114 of the substrate 110 and the base portion 710. The post shown has a uniform cross-section, but it can also have other shapes (e.g., tapered, tetrahedron, etc.) suitable for MEMS die fabrication processes.

According to a possible embodiment, the die 100 can be in combination with a MEMS sensor housing 700 comprising a lid or cover mounted on a base portion 710. The mounting surface 114 of the substrate 110 can be mounted on the base portion 710, such as via the adhesive 630, and the aperture 116 can extend fully through the substrate 110. The proof mass 130 can be disposed in the aperture 116 between the base portion 710 and the first electrode 121. According to a possible embodiment, the housing 700 can also include a lid 720.

According to a possible embodiment, the die 100 can include a displacement-limiting support member 620 that can be coupled to the base portion 710. The displacement-limiting support member 620 can be integral with the die 100, such as by being part of the substrate 110. For example, displacement-limiting support member 620 can be fabricated by bonding two separate dies after etching the desired structures, such as by a die bonding process. According to a possible implementation, the displacement-limiting support member 620 can be coupled to the substrate 110. The displacement-limiting support member 620 can be located beneath and spaced apart from the proof mass 130. The displacement-limiting support member 620 can limit displacement of the proof mass 130 in a direction of movement of the first electrode 121 and/or the second electrode 122 to which the proof mass 130 is coupled.

According to a possible implementation, the displacement-limiting support member 620 can be separate from the die 100. For example, the displacement-limiting support member 620 can be a copper pillar, can be a silicon pillar, can be a glass pillar, can be fabricated from the same material as the base portion 710, or can be made from any other material. According to a possible implementation, the displacement-limiting support member 620 can be larger in height than the post 610.

Figure 7:
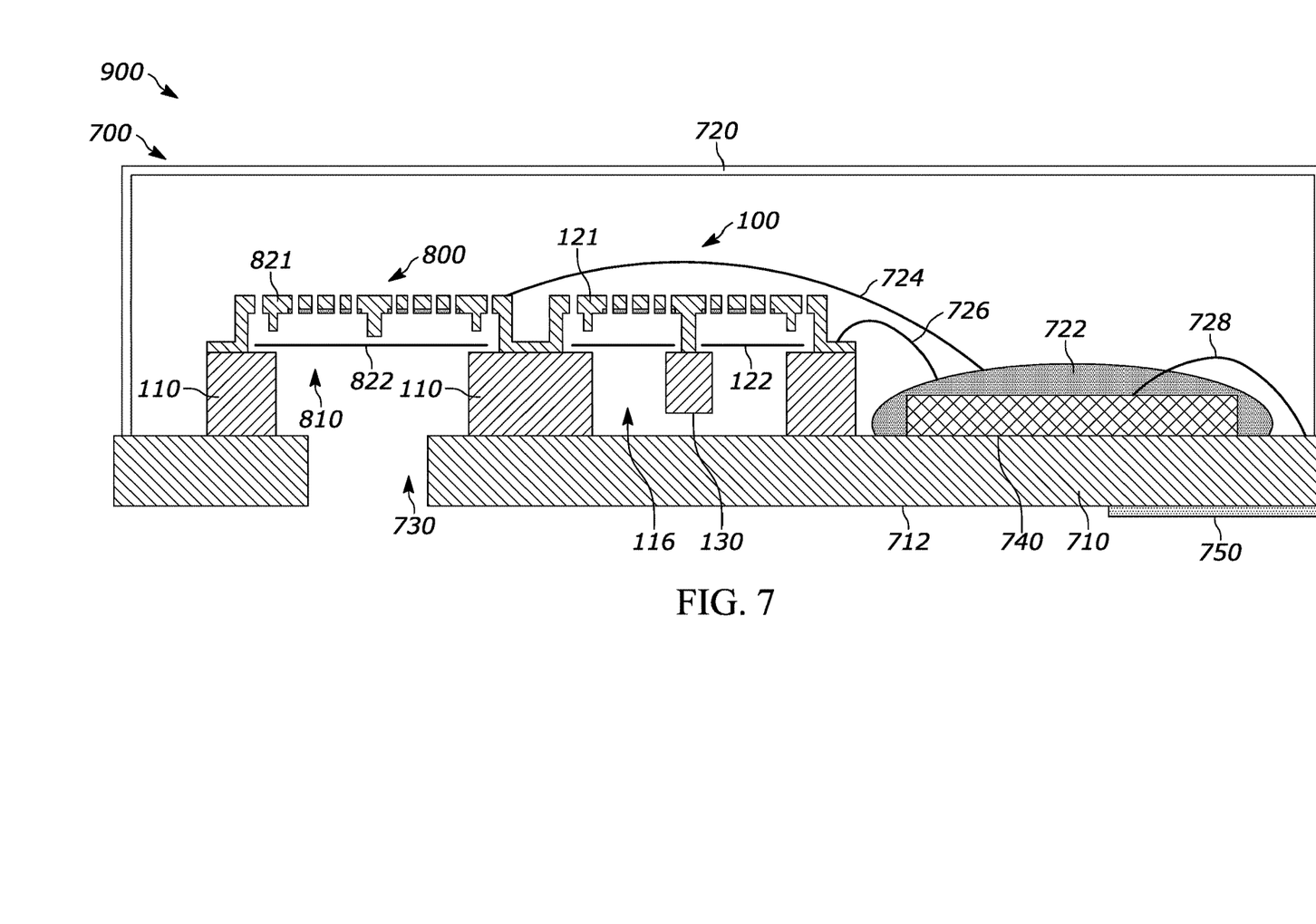
FIG. 7 is a schematic illustration of a microphone assembly including the vibration sensor die of FIG. 1, according to a possible embodiment.

FIG. 7 is a schematic illustration of a microphone assembly 900 including the vibration sensor die 100 and the housing 700, according to a possible embodiment. While the proof mass 130 is illustrated as a solid proof mass in this embodiment, it can also be of any other form, such as shown in the preceding embodiments. Similarly, this embodiment and other embodiments can include or exclude other aspects of the other embodiments.

The housing 700 can include the lid 720 mounted on the base portion 710. The microphone assembly 900 can also include an integrated circuit 740 disposed in the housing 700. The integrated circuit 740 can be electrically coupled to the vibration sensor die 100 and to electrical contacts on a surface-mount interface 750 disposed on an external surface 712 of the base portion 710.

According to possible embodiments, the surface-mount interface 750 can have a plurality of contacts coupled to the integrated circuit 740, such as to connection pads, such as bonding pads, which can be provided on the integrated circuit 740. The contacts may be embodied as pins, pads, bumps, balls, and/or other structures. The functions and number of contacts on the surface-mount interface 750 can depend on the protocol or protocols implemented and may include power, ground, data, and clock contacts among others. The surface-mount interface 750 can permit integration of the microphone assembly 900 with a host device using reflow-soldering, fusion bonding, or other assembly processes.

According to a possible embodiment, the microphone assembly 900 can include an acoustic sensor 800. The aperture 116 can be a first aperture 116 and the acoustic sensor 800 can include a second aperture 810 extending through a second portion of the substrate 110. The acoustic sensor 800 can include a first acoustic electrode 821 coupled to the substrate 110 and positioned over the second aperture 810. The acoustic sensor 800 can include a second acoustic electrode 822 disposed between the substrate 110 and the first acoustic electrode 821. The second acoustic electrode 822 can be spaced apart from the first acoustic electrode 821. The first acoustic electrode 821 or second acoustic electrode 822 can be movable relative to the other in response to sound.

According to a possible embodiment, the housing 700 can have a sound port 730 acoustically coupled to the second aperture 810 of the substrate 110. The sound port 730 can be in the base portion 710, in the lid 720, or anywhere else on the housing 700. The acoustic sensor 800 can be positioned on the sound port 730 such that the second aperture 810 is aligned with the sound port 730 to allow reception of an acoustic signal received through the sound port 730.

According to a possible embodiment, the integrated circuit 740 can be positioned on the base portion 710 and can be electrically coupled to the acoustic sensor 800, to the vibration sensor 100, and to electrical contacts on a surface-mount interface 750 disposed on the external surface 712 of the base portion 710. For example, the integrated circuit 740 can be electrically coupled, e.g., wire bonded, to the acoustic sensor 800, such as via a first electrical lead 724, and to the vibration sensor 100 via second electrical lead 726. The integrated circuit 740 can also be coupled to the base portion 710, such as to a trace or other electrical contact disposed on the base portion 710, via a third electrical lead 728. The integrated circuit 740 can receive an electrical signal from the acoustic sensor 800 and the vibration sensor 100. According to a possible implementation, the base portion 710 can include a Printed Circuit Board (PCB) configured to mount the vibration sensor die 100, the acoustic sensor 800, the integrated circuit 740, and the lid 720 thereon.

In some implementations, an encapsulant 722 can be disposed on the integrated circuit 740. The encapsulant can include, for example an epoxy or other material that protects the integrated circuit from moisture and/or dissipates heat.

The vibration sensor 100, the acoustic sensor 800, and the integrated circuit 740, are shown disposed on a surface of the base portion 710. In other embodiments one or more of these components may be disposed on the lid 720, on an inner surface of the lid 720, on sidewalls of the lid 720, and/or stacked atop one another.

According to a possible first embodiment related to the above embodiments, a microelectromechanical systems (MEMS) vibration sensor die comprises a substrate having a top portion, a mounting surface, and an aperture extending at least partially through a portion of the substrate. The die comprises a first electrode coupled to the top portion of the substrate and positioned over the aperture. The die comprises a second electrode disposed between the substrate and the first electrode, where the second electrode is spaced apart from the first electrode. The die comprises a proof mass coupled to the first or second electrode, the proof mass freely suspended within aperture, and the proof mass recessed relative to the mounting surface of the substrate. The proof mass moves the first electrode or the second electrode from which it is suspended in response to vibration.

According to a second possible embodiment related to the first embodiment the die comprises a lateral support member adjacent the proof mass, wherein the lateral support member limits movement of the proof mass in a direction non-parallel to a direction of movement of the first or second electrode to which the proof mass is coupled.

According to a third possible embodiment, related to the second embodiment, the die further comprises a plurality of protrusions, the plurality of protrusions extending from the substrate toward the proof mass or from the proof mass toward the substrate, wherein the lateral support member is a part of the substrate from which the protrusions extend or a part of the substrate toward which the protrusions extend from the proof mass.

According to a fourth possible embodiment related to the third embodiment, the proof mass has a hollow portion and the substrate substantially surrounds the proof mass.

According to a fifth possible embodiment related to the first embodiment, the die further comprises a protrusion extending from the mounting surface of the substrate and integrally formed therewith.

According to a sixth possible embodiment related to any of the first through fifth embodiments, the die comprises a displacement-limiting support member coupled to the substrate, the displacement-limiting support member located beneath and spaced apart from the proof mass, wherein the displacement-limiting support member limits displacement of the proof mass in a direction of movement of the first or second electrode to which the proof mass is coupled.

According to a seventh possible embodiment related to the third embodiment, the die further comprises an acoustic sensor. The acoustic sensor comprises a second aperture extending through a second portion of the substrate. The acoustic sensor comprises a first acoustic electrode coupled to the substrate and positioned over the second aperture. The acoustic sensor comprises a second acoustic electrode disposed between the substrate and the first acoustic electrode, where the second acoustic electrode is spaced apart from the first acoustic electrode. The first acoustic electrode or second acoustic electrode is movable relative to the other in response to sound.

According to an eighth possible embodiment related to one of the first through fifth embodiments, the die is in combination with a base portion of a MEMS sensor housing, the mounting surface of the substrate mounted on the base portion and the aperture extending through the substrate, and the proof mass disposed between the base portion and the first electrode. The die is also in combination with a displacement-limiting support member coupled to the base portion, the displacement-limiting support member located beneath and spaced apart from the proof mass, wherein the displacement-limiting support member limits displacement of the proof mass in a direction of movement of the first or second electrode to which the proof mass is coupled.

According to a ninth possible embodiment related to the eighth embodiment, the combination further comprises an adhesive coupling the mounting surface of the substrate to the base portion; and at least one rigid post embedded in the adhesive and disposed between the substrate and the base portion.

According to a tenth possible embodiment related to the ninth embodiment, the combination further comprises a MEMS sensor housing comprising a lid mounted on the base portion; and an integrated circuit disposed in the housing, the integrated circuit electrically coupled to the vibration sensor and to electrical contacts on a surface-mounting interface disposed on an external surface of the base portion.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

We claim:

1. A microelectromechanical systems (MEMS) vibration sensor die comprising:
    a substrate having a top portion, a mounting surface, and an aperture extending at least partially through the substrate;
    a plurality of posts protruding from the mounting surface of the substrate, the plurality of posts formed integrally with the substrate;
    an adhesive surrounding a periphery of each post of the plurality of posts;
    a first electrode coupled to the top portion of the substrate and positioned over the aperture;
    a second electrode disposed between the substrate and the first electrode, where the second electrode is spaced apart from the first electrode;
    a proof mass having:
        a first portion coupled to the first electrode or the second electrode; and
        a second end opposite the first portion, the second end recessed within the aperture relative to the mounting surface of the substrate,
    wherein the proof mass is suspended freely within the aperture, and wherein the proof mass moves the first electrode or the second electrode from which it is suspended in response to vibration.

2. The die according to claim 1 further comprising a lateral support member adjacent the proof mass, wherein the lateral support member limits movement of the proof mass in a direction non-parallel to a direction of movement of the first or second electrode to which the proof mass is coupled.

3. The die according to claim 2 further comprising a plurality of protrusions, the plurality of protrusions extending from the substrate toward the proof mass or from the proof mass toward the substrate, wherein the lateral support member is a part of the substrate from which the protrusions extend or a part of the substrate toward which the protrusions extend from the proof mass.

4. The die according to claim 3, wherein the proof mass has a hollow portion and the substrate substantially surrounds the proof mass, where the hollow portion extends throughout the proof mass from the first portion to the second end, where the hollow portion has a width in a direction parallel to the mounting surface, where the width is constant from the first portion to the second end.

5. The die according to claim 3 in combination with:
    a base portion of a MEMS sensor housing, the mounting surface of the substrate mounted on the base portion and the aperture extends fully through the substrate, and the proof mass disposed between the base portion and the first electrode; and
    a displacement-limiting support member coupled to the base portion, the displacement-limiting support member located beneath and spaced apart from the proof mass, wherein the displacement-limiting support member limits displacement of the proof mass in a direction of movement of the first or second electrode to which the proof mass is coupled.

6. The combination according to claim 5,
    wherein the adhesive couples the mounting surface of the substrate to the base portion, and
    wherein the posts are embedded in the adhesive and disposed between the substrate and the base portion.

7. The combination according to claim 6 further comprising:
    a MEMS sensor housing comprising a lid mounted on the base portion; and
    an integrated circuit disposed in the housing, the integrated circuit electrically coupled to the vibration sensor and to electrical contacts on a surface-mount interface disposed on an external surface of the base portion.

8. The die according to claim 3,
    wherein the aperture comprises a first aperture,
    wherein the die is in combination with:
    an acoustic sensor comprising:
        a second aperture extending through a second portion of the substrate;
        a first acoustic electrode coupled to the substrate and positioned over the second aperture; and
        a second acoustic electrode disposed between the substrate and the first acoustic electrode, the second acoustic electrode spaced apart from the first acoustic electrode, and
    wherein the first acoustic electrode or second acoustic electrode is movable relative to the other in response to sound.

9. The die according to claim 8 in combination with:
    wherein the adhesive couples the mounting surface of the substrate to the base portion; and
    wherein the posts are embedded in the adhesive and disposed between the substrate and the base portion.

10. The die according to claim 9 in combination with:
    a MEMS sensor housing comprising a lid mounted on the base portion, the MEMS sensor housing having a sound port acoustically coupled to the second aperture of the substrate; and
    an integrated circuit disposed in the housing, the integrated circuit electrically coupled to the acoustic sensor, to the vibration sensor, and to electrical contacts on a surface-mount interface disposed on an external surface of the base portion.

11. The die according to claim 1 further comprising a displacement-limiting support member coupled to the substrate, the displacement-limiting support member located beneath and spaced apart from the proof mass, wherein the displacement-limiting support member limits displacement of the proof mass in a direction of movement of the first or second electrode to which the proof mass is coupled.

12. The die according to claim 1, wherein the die comprises a semiconductor.

13. A microelectromechanical systems (MEMS) vibration sensor die comprising:
   a substrate having a top portion and a mounting surface;
   an aperture extending at least partially through the substrate;
   a plurality of posts protruding from the mounting surface of the substrate, the plurality of posts formed integrally with the substrate;
   an adhesive surrounding a periphery of each post of the plurality of posts;
   capacitive electrodes arranged in spaced apart relation and disposed on the top portion of the substrate, at least one of the capacitive electrodes coupled to the substrate; and
   a proof mass coupled to one of the capacitive electrodes and suspended freely within the aperture, the proof mass substantially surrounded by the substrate and recessed relative to the mounting surface of the substrate,
   wherein the proof mass moves the capacitive electrode from which it is suspended in response to vibration.

14. The die according to claim 13 further comprising a lateral support member comprising a plurality of protrusions, the plurality of protrusions extending from the substrate toward the proof mass or from the proof mass toward the substrate, wherein the lateral support member limits movement of the proof mass in a direction non-parallel to a direction of movement of the capacitive electrode to which the proof mass is coupled.

15. The die according to claim 14,
   wherein the proof mass has a first end proximal to the electrodes and a second end distal from the electrodes, where the proof mass has a hollow portion that extends throughout the proof mass from the first end to the second end, and where the substrate substantially surrounds the proof mass, and
   wherein the hollow portion has a width in a direction parallel to the mounting surface, where the width is constant from the first end to the second end.

16. The die according to claim 15, wherein the die comprises a semiconductor material.

* * * * *